(12) United States Patent
Lin

(10) Patent No.: US 7,524,739 B2
(45) Date of Patent: Apr. 28, 2009

(54) METHOD OF IMPROVING A SURFACE OF A SEMICONDUCTOR SUBSTRATE

(75) Inventor: Wen Lin, Emmaus, PA (US)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 113 days.

(21) Appl. No.: 11/677,871

(22) Filed: Feb. 22, 2007

(65) Prior Publication Data
US 2008/0124899 A1 May 29, 2008

(30) Foreign Application Priority Data
Nov. 27, 2006 (EP) .................................. 06291827

(51) Int. Cl.
*H01L 21/20* (2006.01)
*H01L 21/36* (2006.01)
(52) U.S. Cl. ...................... 438/479; 438/478; 438/481; 438/482; 257/E21.001; 257/E21.598
(58) Field of Classification Search ................. 438/471, 438/478, 479, 481, 482; 257/E21.001
See application file for complete search history.

(56) References Cited

U.S. PATENT DOCUMENTS

| 5,004,702 | A | * | 4/1991 | Samata et al. ............... 438/232 |
| 5,045,494 | A | * | 9/1991 | Choi et al. ................... 438/256 |
| 5,227,330 | A | | 7/1993 | Agnello et al. ............... 437/108 |
| 5,599,724 | A | * | 2/1997 | Yoshida ....................... 438/192 |
| 6,284,629 | B1 | | 9/2001 | Yokokawa et al. ........... 438/459 |
| 6,287,941 | B1 | | 9/2001 | Kang et al. .................. 438/459 |
| 6,521,508 | B1 | | 2/2003 | Cheong et al. ............... 438/416 |
| 6,928,879 | B2 | * | 8/2005 | Partridge et al. ............... 73/754 |
| 2004/0045499 | A1 | * | 3/2004 | Langdo et al. ................. 117/84 |
| 2006/0138540 | A1 | | 6/2006 | Dantz et al. .................. 438/795 |

FOREIGN PATENT DOCUMENTS

| FR | 2762136 | 10/1998 |
| KR | 1999024549 | 4/1999 |
| KR | 20020001417 | 1/2002 |

OTHER PUBLICATIONS

Akihiro Miyouchi et al., XP000248111, "Low-Temperature (850° C.) Silicon Selective Epitaxial Growth On HF-Treated Si (100) Substrates Using $SiH_4$-HCl-$H_2$ Systems", Journal Of The Electrochemical Society, vol. 138, No. 11, pp. 3480-3883 (1991).

(Continued)

*Primary Examiner*—Walter L Lindsay, Jr.
*Assistant Examiner*—Abdulfattah Mustapha
(74) *Attorney, Agent, or Firm*—Winston & Strawn LLP

(57) ABSTRACT

The invention relates to a method of improving a surface of a semiconductor substrate which is at least partially made of silicon. Defects present in or on the semiconductor substrate can be really repaired to provide a semiconductor substrate with a high surface quality. This is achieved by a selective epitaxial deposition in the at least one hole in the surface of the semiconductor substrate. Generally, the deposition step is preceded by an etching step which removes the defects and leaves behind at least one hole that can be plugged or filled with the selective epitaxial deposition of silicon to repair the substrate.

19 Claims, 3 Drawing Sheets

OTHER PUBLICATIONS

C. Jahan et al., XP004929415, "Agglomeration Control During The Selective Epitaxial Growth Of Si Raised Sources And Drains On Ultra-Thin Silicon-On-Insulator Substrates", Journal Of Crystal Growth, vol. 280, No. 3-4, pp. 530-538 (2005).

Ivo J. Raaijmakers et al., XP012007735, "Enabling Technologies For Forming And Contacting Shallow Junctions In Si: HF-Vapor Cleaning And Selective Epitaxial Growth Of Si And SiGe", Journal Of Vacuum Science & Technology B, vol. 17, No. 5, pp. 2311-2320, (1999).

* cited by examiner

METHOD OF IMPROVING A SURFACE OF A SEMICONDUCTOR SUBSTRATE

BACKGROUND ART

The invention relates to a method of improving a surface of a semiconductor substrate, wherein the surface at least partially includes silicon.

In semiconductor device production, it is more and more important to provide semiconductor substrates of a very high quality. Defects of semiconductor substrates can be of very different origin and may occur in the bulk material of wafers or layers or on the surface of a structure. Deficient wafers, such as wafers or layers with holes or scratches on their surface or with oxide precipitates or so-called "HF-defects", which are present in or on a wafer and will be apparent by an HF-etch step, are mostly not suitable for further use.

To improve the surface characteristic of a defective wafer, a wafer treatment of a wafer surface such as an etching step or a chemical mechanical polishing ("CMP") step can be used to remove or to reduce the number or the size of defects at or near the wafer surface. Typical etchants are halogen bearing compounds such as HCl, HBr, HI, HF, and others. The etchant can also be a fluorine bearing compound such as $SF_6$, or $C_xF_x$. Moreover or in addition, it is possible to treat a defect containing wafer thermally, preferably in a hydrogen bearing environment, to smooth it and to diminish its defects. The thermal treatment can be performed in a furnace or in a tool for rapid thermal processing ("RTP"). According to another approach disclosed in U.S. Pat. No. 6,287,941 B1, a defective wafer such as a cleaved film can be subjected to a combination of etching and deposition at very high temperature using a combination of etchant and deposition gases to result in a better surface quality.

Although such methods lead, in the first instance, to a superficial improvement of the surface condition of a defective wafer by smoothing, abrasion or defect covering of the respective wafer, the known methods are mostly very laborious and the corresponding defects cannot really be repaired. Thus, there remains a need to process defective wafers to increase surface quality.

SUMMARY OF THE INVENTION

The present invention now provides a method of improving a surface of a semiconductor substrate that is at least partially made of silicon, wherein defects present in or on the semiconductor substrate can be really repaired to provide a semiconductor substrate that has a high surface quality. This method comprises a deposition step comprising a selective epitaxial deposition of silicon in at least one hole on the surface of the semiconductor substrate.

The present invention makes it possible to deposit silicon in the hole(s) to seal or to close them selectively with high-quality mono-crystalline silicon material wherein the formation of polycrystalline silicon is avoided, such that the original hole disappears from the surface and the resulting repaired surface provides a high surface quality which is comparable to surfaces which are free from holes or defects from the outset.

In a preferred variation of the invention, the deposition step comprises a selective growth of silicon on at least a part of a side wall of the hole(s). In this manner, holes in the silicon layer lying on another material can be closed by a gradual growth beginning from the side walls of the corresponding hole. This kind of method is, in particular, of interest for closing large holes in SOI structures with high-quality silicon.

In another preferred variation of the invention, the method comprises an etching step applied on the surface of the semiconductor substrate before the deposition step. The etching step comprises an etch-back of at least one defect present on the surface of the semiconductor substrate thereby forming at least one hole on the surface. By this etching step, the at least one defect can be removed leading to at least one hole at the surface of the semiconductor structure which can then be closed with silicon with the result that the original defect can be removed and a nearly perfect repaired surface of the originally defective semiconductor structure can be provided.

According to an advantageous embodiment of the invention, the deposition step is applied at least until the at least one hole is plugged with silicon. In some cases, it can be sensible or sufficient only to plug the hole so that the hole is closed wherein it is of minor interest whether the whole hole is filled with silicon or not. In any case, as a result, the former hole in the surface of the semiconductor structure treated with this method is closed so that this semiconductor structure can be used for further processing.

Preferably, the deposition step is applied at least until the at least one hole is plugged or filled with silicon. In doing so, the former hole can be fully removed and the resulting structure can be provided with a high-quality both at and under the surface.

Advantageously, the etching step comprises a HF-dip to etch-back oxide containing defects at the surface of the semiconductor structure. An HF-etch step removes effectively oxide and thus reveals oxide containing defects at the surface resulting in a formation of holes on the surface which in turn can be closed with the selective deposition of silicon.

According to a preferred embodiment of the invention, in the selective epitaxial deposition, etchant and silicon containing gas are used as source gas. HCl as the etchant and $SiH_2Cl_2$ as the silicon containing gas are especially well suited material for providing a high-quality selective deposition of monocrystalline silicon since the respective source gas highly prevents nucleation of silicon on oxide surfaces or walls which would result in a growth of polysilicon. For selective epitaxial growth, favorable etchant concentrations are a few % of the total volume of the source gas.

In another preferred embodiment of the present invention, silicon is deposited in the deposition step up to a thickness corresponding at least to about one half of the diameter of the hole on the surface. This thickness has been shown to be especially advantageous for a solid and durable sealing of the respective hole.

In order to remove contaminants from the etched surface, it has been shown as advantageous to apply a $H_2$ bake at about 650° C. to 800° C., preferably for about 2 minutes, on the semiconductor structure before the deposition step. This relatively low-temperature $H_2$ bake leads to an effective removal of contaminants but to a low risk of agglomeration of silicon during the deposition step.

It has been shown to be advantageous to perform the deposition step at about 750° C. This deposition temperature is lower than the temperature used in standard epitaxy processes. That way, agglomeration of silicon can be avoided, in particular if SOI structures with thin silicon top layers are treated with the inventive method.

In a further embodiment of the invention, the deposition step is performed under reduced pressure, for example from about 20 Torr to 80 Torr. The deposition in a reduced atmosphere with this pressure leads to especially good and homogenous silicon formation.

In another variation of the invention, the thickness of silicon on the surface of the semiconductor substrate is reduced before or after the deposition step. This enables a reduction of the final thickness of the treated semiconductor substrate, which can be in particular of importance in repairing of SOI wafers.

BRIEF DESCRIPTION OF THE DRAWINGS

Advantageous embodiments of the invention will be described in the following with respect to the drawing figures in which.

DETAILED DESCRIPTION OF THE PREFERRED EMBODIMENTS

Figure 1:
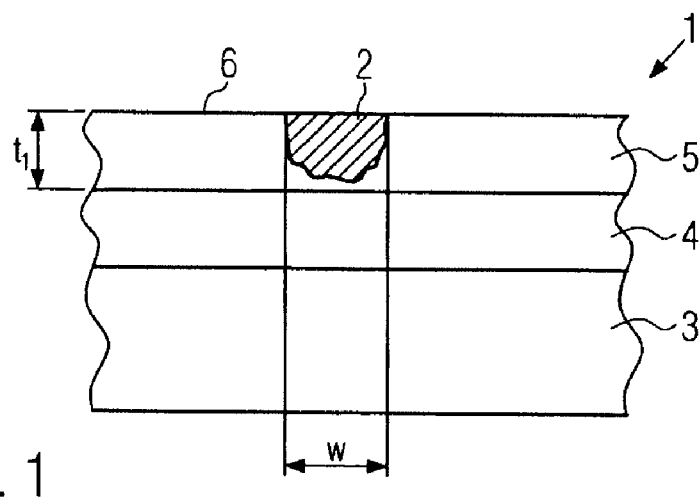
FIG. 1 schematically shows a SOI substrate containing a defect.

FIG. 1 schematically shows a SOI substrate 1 containing at least one defect such as a HF-defect or the shown oxide precipitate 2. The SOI substrate 1 is only shown exemplarily to demonstrate the principle of the present invention, wherein the present invention can also be used to improve the surface quality of another semiconductor substrate like a silicon wafer or any other substrate having on top at least partially silicon. In particular, it is not necessary to provide a substrate with an oxide layer, as shown in FIG. 1, to apply the inventive idea of repairing this substrate.

The inventive method is also applicable to other materials such as silicon alloys, for example SiGe structures.

The SOI substrate of FIG. 1 comprises a silicon substrate 3, on which a buried oxide 4 is formed, and has on top a silicon layer 5 having a certain thickness $t_1$ and comprising the at least one defect such as the shown oxide precipitate 2 situated at a surface 6 of the silicon layer 5 and extending into the bulk region of this silicon layer 5. The only one defect shown in FIG. 1 consists in the example shown mainly of silicon dioxide and is only shown exemplarily to illustrate the idea of the invention, wherein in fact considerably more defects as the one defect shown can be present in or on the silicon layer 5. The oxide precipitate of FIG. 1 shall show exemplarily a "small" defect having a rather small lateral extension being in the order of magnitude of the thickness of the silicon layer 5 or smaller.

Figure 2:
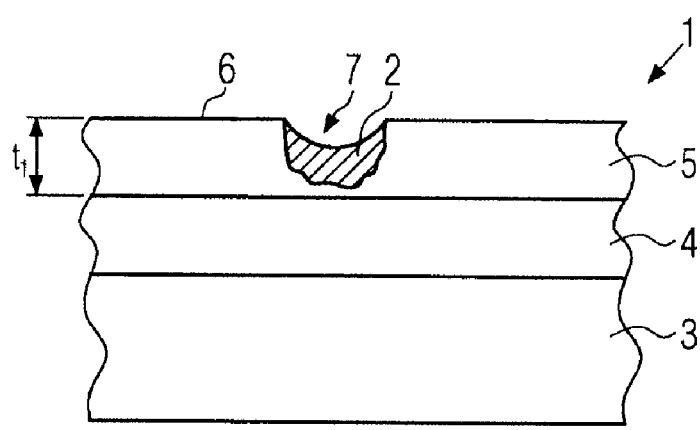
FIG. 2 schematically shows the substrate of FIG. 1 after a short HF dip.

According to FIG. 2, the structure shown in FIG. 1 is subjected to HF leading to an at least partial removal of the oxide precipitate 2 beginning at the surface 6 and continuing in the depth of the oxide precipitate 2 without or with only minimum effects on the silicon layer 5 since HF etches silicon with a much lower rate than silicon dioxide. In the same way, the HF dip treatment can be used to etch-back HF-defects to create space which can be plugged or filled in a subsequent process step described below with defect-free silicon.

Figure 4:
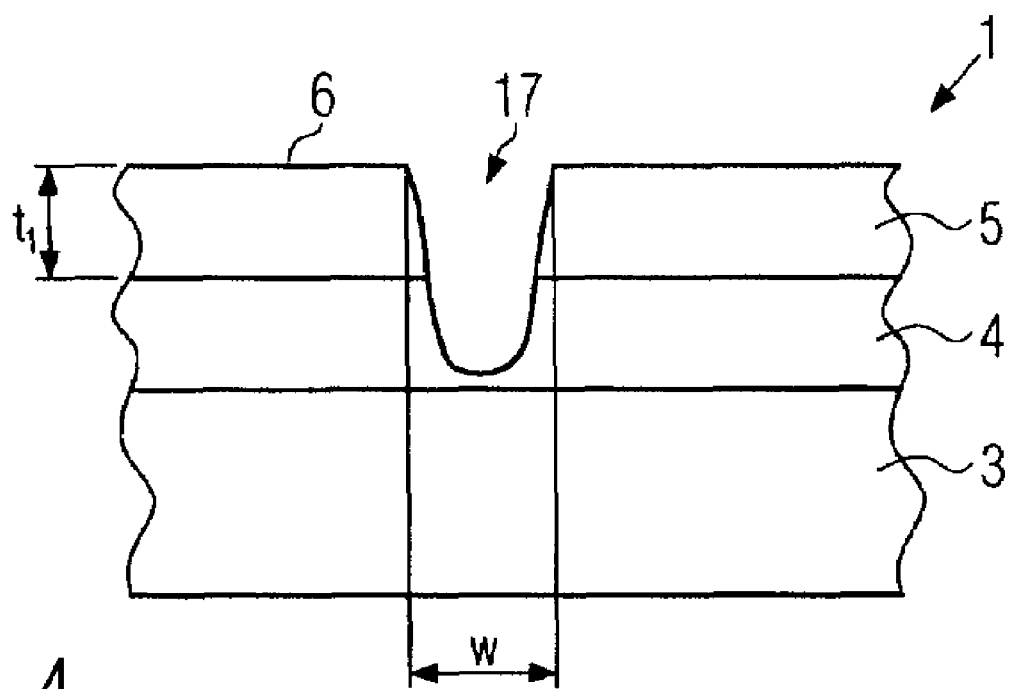
FIG. 4 schematically shows after a deeper HF dip.

The longer the HF dip the deeper is the resulting hole 7 in the surface 6 of the SOI structure 1. As shown in FIG. 4, a longer HF dip can result in a hole 17 extending into the buried oxide layer 4 underlying the silicon layer 5.

Figure 3:
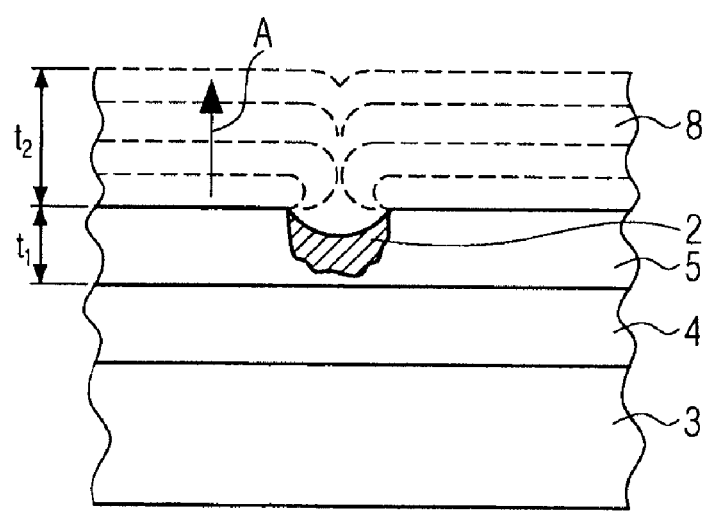
FIG. 3 schematically shows the substrate of FIG. 2 after selective deposition of silicon.

FIG. 3 schematically shows the SOI substrate of FIG. 2 after a selective deposition of silicon using Selective Epitaxial Growth (SEG) wherein the dashed lines and the direction of arrow A shall demonstrate schematically the progress of silicon deposition leading to a thickness $t_2$ of the resulting silicon top layer 8.

SEG is an epitaxial deposition process which has the advantage that it will prevent, in general, nucleation of silicon on a polycrystalline or an amorphous material like an oxide surface. An epitaxial silicon growth does only occur on monocrystalline silicon.

Prior to the SEG step, wet cleaning and in situ $H_2$ bake at about 650° C. to 800° C. for about 2 minutes under a reduced pressure, for example of 20 Torr is applied on the SOI-structure shown in FIG. 2 in order to remove C, O and F contaminants on the surface 6. If a bulk material such as a silicon wafer shall be repaired instead of the SOI-structure shown in FIG. 2, the $H_2$ bake is performed at higher temperatures. If the silicon layer 5 is thinner than 20 nm, temperatures in excess of about 700° C. should not be applied during $H_2$ bake on the SOI structure 1 to prevent a Si film retraction during SEG. Only in cases in which the film thickness of the silicon layer 5 is higher than 20 nm, the $H_2$ bake can be performed at temperatures up to 850° C. or higher. Although in comparison with other conventional $H_2$ bake processes the recommended temperature of the invention for the $H_2$ bake is relatively low, the contaminants left on the surface 6 prior SEG silicon formation have not such an impact on the electrical properties of the resulting devices since they will be partially consumed or removed during later procedural steps. The $H_2$ bake is followed by a ramping-up of the temperature up to the temperature of the SEG step.

To avoid an agglomeration of silicon, the SEG of silicon is performed in a reduced atmosphere of about 20 Torr applying a relatively low temperature of about 650° C. to 800° C. and using for instance HCl as an etchant and for instance $SiH_2Cl_2$ as the Si gaseous precursor and using $H_2$ as carrier gas, optionally with some gaseous hydrochloric acid to achieve full selectivity vs. $SiO_2$ and $Si_3N_4$. For an ultra-thin silicon layer 6 with a thickness $t_1$ in the range of 3 to 10 nm, the SEG step should be performed at about 750° C. using for example a $SiH_2Cl_2$+HCl chemistry to avoid any severe islands formation during silicon growth. During SEG, the growth rate of silicon should be fairly low which can be achieved by source gas reduction wherein the reaction rate is reduced in the presence of HCl.

As shown schematically in FIG. 3 by the dashed lines, silicon grows during SEG on the surface 6 of the silicon layer 5, on the open silicon at the side walls of the etched hole 7 as well as on the already grown silicon in such a way that the hole in the silicon layer 6 is gradually closed or plugged with silicon. After a certain process time, a thickness $t_2$ of silicon with a high surface quality is reached on top of the silicon layer 6. The non-etched part of the defect 2 and a small unfilled residual part of the etched hole 7 are buried in the structure above the oxide surface where no nucleation occurs.

If the defect shown in FIG. 1 is fully etched away during the etching step and the etching step is performed in such a way that the buried oxide below the silicon layer 5 is not influenced, the defect(s) in or on the silicon layer 5 can be fully removed and replaced by high-quality silicon resulting in a nearly perfect structure having a surface 6 without defects or with only a minimum of defects.

During the SEG deposition step, it can be assumed that the opening of the hole 7 is sealed if the thickness $t_2$ of the deposited silicon layer is about ½ of the diameter w of the hole 7. Therefore, a minimum epitaxial thickness $t_2$ of about ½ of the hole 7 diameter w is necessary in order to seal the opening.

With reference to FIG. 4, the structure of FIG. 1 is etched deeper than in FIG. 2 during the etching step so that the buried oxide 4 lying under the silicon layer 5 was affected. The resulting hole 17 in the SOI structure 1 has silicon side walls formed by the silicon layer 5 and a bottom of silicon dioxide formed by the attacked buried oxide layer 4.

Figure 5:
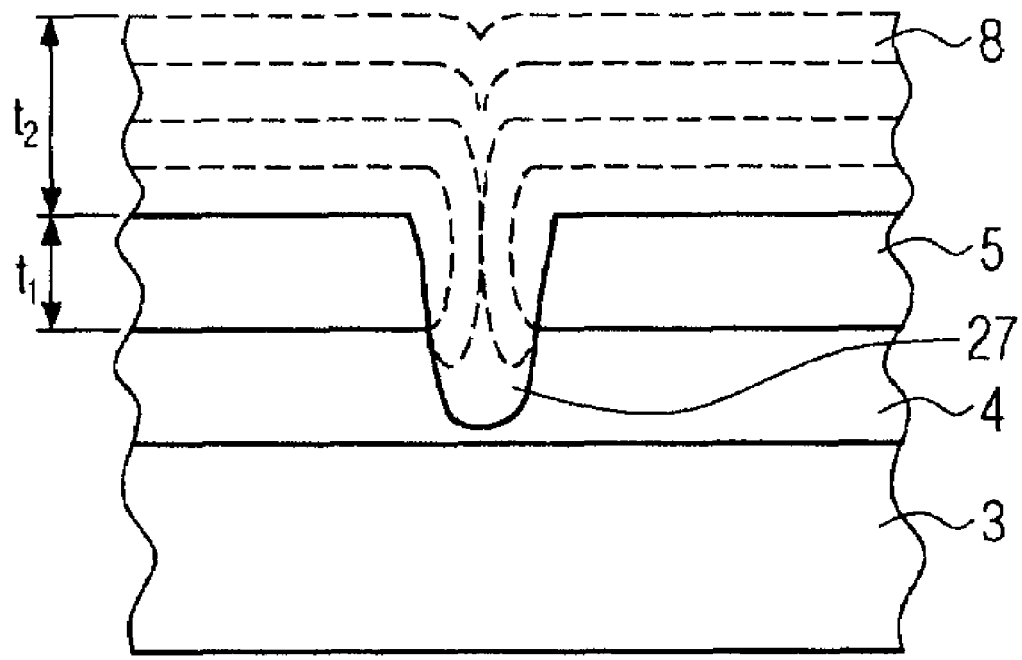
FIG. 5 schematically shows the substrate of FIG. 4 after selective deposition of silicon.

As shown schematically in FIG. 5, the hole 17 of the SOI substrate of FIG. 4 is gradually filled during the SEG process with silicon. At a certain time of growth, the hole 17 is plugged and covered with high-quality mono-crystalline silicon wherein a little cavity 27 can remain in the buried oxide layer 4 which hole 27 is not filled with silicon.

Figure 6:
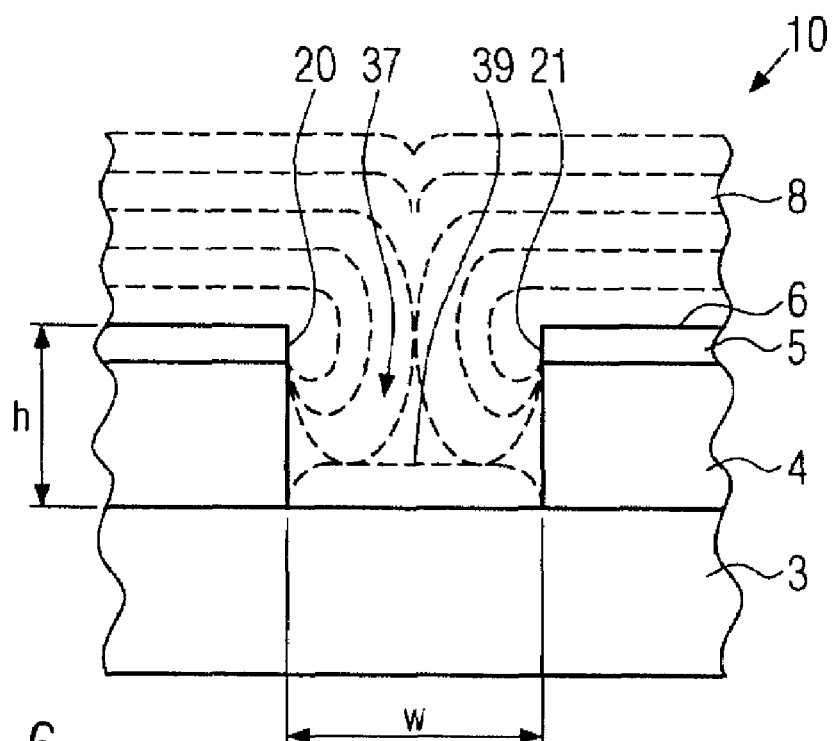
FIG. 6 schematically shows a hole in a SOI-substrate sealed with silicon in accordance with the present invention.
Figure 7:
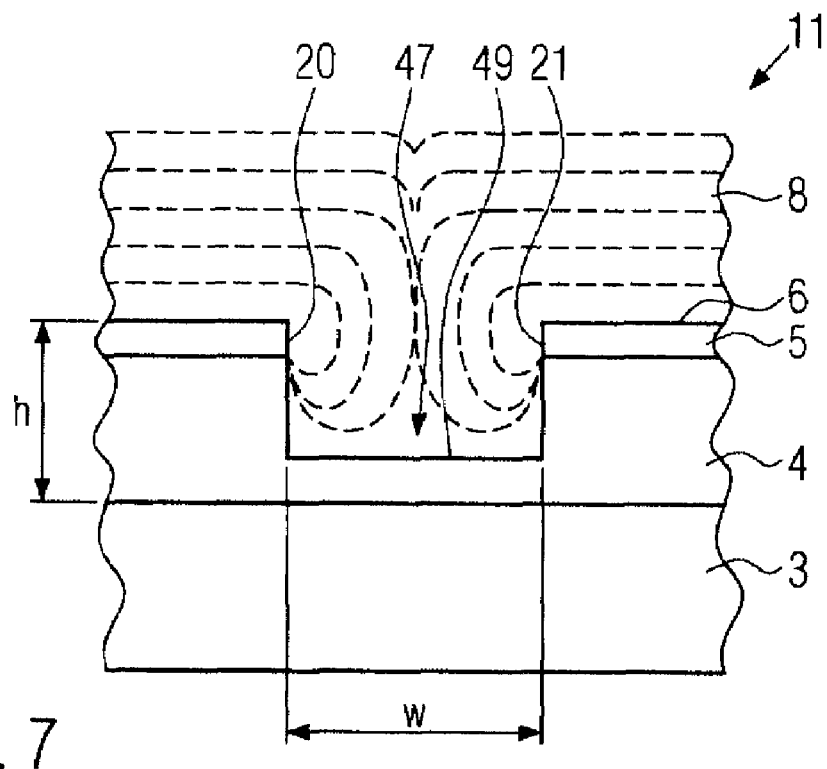
FIG. 7 schematically shows another hole in a SOI-substrate sealed with silicon in accordance with the present invention.

FIGS. 6 and 7 show schematically that the idea of the invention can also be used to improve the surface quality of substrate or structures having on top layer with "larger" holes such as "wells" having a large aspect ratio wherein the width w of the holes is a few times higher than their depth h (w/h>>1). In the examples shown in FIGS. 6 and 7, the diameter w of the holes 37 and 47 is about 0.5 μm, the silicon top layer 5 has a thickness of about 50 nm and the oxide layer 4 has a thickness of about 150 nm resulting in an aspect ratio of 2.5. The arched lines in the FIGS. 6 and 7 indicate the sequence of epitaxial deposition.

With reference to FIG. 6, a SOI substrate 10 is shown, the SOI substrate 10 consisting of a silicon substrate 3, an oxide layer 4 on the silicon substrate 3 and a thin silicon top layer 5. The SOI substrate 10 has a hole 37 through the silicon top layer 5 and the oxide layer 4. The hole 37 has in the example shown nearly perpendicular, flat side walls formed, for instance, by photolithography and etching, but can have, in other not shown embodiments of the present invention, also inclined and/or rough side walls. The bottom 39 of the hole 37 is formed by the surface of the silicon substrate 3 and consists, therefore, of mono-crystalline silicon.

In the embodiment shown in FIG. 6, the surface 6 of the structure 10 can be smoothed and straightened by filling the hole 37 in accordance with the present invention using the Selective Epitaxial Growth of silicon. In the particular case shown in FIG. 6, a HF dip prior SEG is not necessary but can, for instance if native oxide should be removed from the bottom 39, be applied. As explained above with reference to FIGS. 3 and 5, it is furthermore possible to apply a wet cleaning step before SEG.

As also explained above with reference to FIGS. 3 and 5, prior to SEG a $H_2$ bake is applied. Then follows a SEG step in accordance with the exemplification of FIGS. 3 and 5. During the SEG step, silicon grows on the exposed silicon areas of the structure 10, in particular on the surface 6 of the silicon layer 5, on the exposed side walls 20, 21 of the silicon layer 5 and on the bottom 39 of the hole 37 as well as on the already grown silicon. As result, the silicon grows in such a way that the hole 37 is gradually filled during SEG with mono-crystalline silicon wherein it can be possible that at the end of SEG very small buried cavities in the former "large" hole 37 remain which are not overgrown.

FIG. 7 schematically shows an oxide hole or well 47 in a SOI substrate 11 sealed with silicon in accordance with the present invention. The SOI substrate 11 consists, like the SOI substrate 10 of FIG. 6, of a silicon substrate 3, an oxide layer 4 and a silicon top layer 5 having a surface 6 with the "large" hole 47 having a more lateral than vertical extension. In contrast to the structure of FIG. 6, the SOI substrate 11 has on the bottom 49 of the hole 47 a residual thickness of $SiO_2$ of the not completely etched oxide layer 4 so that the bottom 49 consists of silicon dioxide. Consequently, the silicon growing during SEG does not form on the bottom 49 but only on the surface 6 and the exposed side walls 20, 21 of the silicon layer 5 as well as on the already grown silicon resulting in an overgrowth of the hole 47 from the sides what can be proceeded till the hole 47 is closed. At the end, there is a smooth, nearly perfect surface of the SOI-substrate formed wherein it is possible that residual little cavities are buried in the treated structure which are not completely filled with mono-crystalline silicon.

In the following, the thickness of the structures as shown in the FIGS. 3, 5, 6 or 7 can be adjusted onto certain requirements by a reduction of the thickness of the grown silicon using oxidation, CMP and/or silicon etching. Optionally, the final SOI thickness can also be thinned by an initial reduction of the thickness $t_1$ of the silicon top layer 5, for instance by oxidation, CMP and/or silicon etching prior to HF-dip or SEG, or by a combination of initial and final thickness reduction. Furthermore, additional finishing steps, like smoothing annealing can be performed on the final structure.

Thus, the present invention offers a method for repairing defects or closing holes in a surface of a semiconductor substrate consisting at least partially of silicon. The method of the invention can be used to repair defects in silicon substrates as well as in Semiconductor on Insulator Substrates (SeOI) like Silicon on Insulator (SOI) wafers. Regarding the repair of defect(s), the combined action of HF dip and SEG leads not only to a removal of the corresponding defect(s) but also to a plug of the etched hole with high-quality mono-crystalline silicon without a formation of poly-Si in the rebuilt structure.

By means of the inventive method which uses as a new approach the SEG process on a blanket silicon surface, the quality of a defective semiconductor substrate can be enhanced making this substrate attractive for further fabrication processes. SOI substrates repaired with the method of the invention are especially well suited for prospective applications where thicker SOI substrates are required. Depending on the respective top layer specifications, in particular the final thickness ($t_1+t_2$) of a repaired substrate can be adapted in such a way that the repaired wafer can rejoin the original product group.

SOI wafers repaired with the method of the invention are applicable for the formation of advanced substrates using Direct Substrates Bonding (DSB). Furthermore, the method according the present invention allows repair of defects occurring in structures produced by the so-called SMART-CUT® process.

Moreover, the inventive technology is in particular advantageous for repairing deep defects or for closing large holes in a semiconductor substrate which can not be repaired or closed using the known surface smoothing methods.

What is claimed is:

1. A method of improving a silicon on insulator semiconductor substrate that has a surface layer that at least partially includes silicon and includes defects, which comprises depositing silicon by selective epitaxial growth (SEG) in at least one hole in the surface of the semiconductor substrate to improve surface quality, wherein the silicon is grown selectively on monocrystalline material silicon but not on polycrystalline or amorphous material to repair the defects in the surface layer.

2. The method of claim 1, wherein the silicon is selectively grown on at least a part of a side wall of the hole.

3. The method of claim 1, which further comprises etching the surface of the semiconductor substrate to form the at least one hole prior to the SEG of silicon therein.

4. The method of claim 3, wherein the etching comprises an etch-back of at least one defect at the surface of the semiconductor substrate thereby forming the at least one hole.

5. The method of claim 1, wherein the SEG is applied at least until the at least one hole is at least plugged with silicon.

6. The method of claim 1, wherein the SEG is applied at least until all holes are filled with silicon.

7. The method of claim 3, wherein the etching step comprises a HF-dip to etch-back oxide containing defect(s) at the surface of the semiconductor substrate.

8. The method of claim 3, wherein an etchant and silicon containing gas are used in combination as a source gas that is applied to the substrate surface.

9. The method of claim 8, wherein the etchant is HCl and the silicon containing gas is $SiH_2Cl_2$.

10. The method of claim 1, wherein the silicon is grown in the SEG step up to a thickness corresponding at least to about one half of the hole diameter.

11. The method of claim 1, wherein prior to growing silicon the semiconductor is treated by a $H_2$ bake at about 650° C. to 800° C.

12. The method of claim 11, wherein the SEG is performed at about 650° C. to 800° C.

13. The method of claim 12, wherein the SEG is performed at about 20 Torr to about 80 Torr.

14. The method of claim 13, wherein the $H_2$ bake is conducted at about 650° C. and the SEG is performed at about 750° C.

15. The method of claim 1, wherein the surface thickness of the semiconductor substrate is reduced before SEG of silicon.

16. The method of claim 1, wherein the surface thickness is reduced after SEG of silicon.

17. The method of claim 1, wherein the surface of the semiconductor substrate comprises a silicon alloy.

18. The method of claim 1, wherein the surface of the semiconductor substrate comprises SiGe.

19. The method of claim 1, wherein the surface of the semiconductor substrate includes a thin Si layer.

* * * * *